(12) United States Patent
Chien et al.

(10) Patent No.: US 12,124,767 B2
(45) Date of Patent: Oct. 22, 2024

(54) AUDIO PLAYER DEVICE, AND METHOD FOR AUTOMATICALLY ADJUSTING AN OUTPUT VOLUME OF THE AUDIO PLAYER DEVICE

(71) Applicant: HEALTH & LIFE CO., LTD., New Taipei (TW)

(72) Inventors: Jen-Chien Chien, New Taipei (TW); Jen-Chieh Lin, New Taipei (TW)

(73) Assignee: HEALTH & LIFE CO., LTD., New Taipei (TW)

( * ) Notice: Subject to any disclaimer, the term of this patent is extended or adjusted under 35 U.S.C. 154(b) by 364 days.

(21) Appl. No.: 17/691,978

(22) Filed: Mar. 10, 2022

(65) Prior Publication Data

US 2022/0300247 A1 Sep. 22, 2022

(30) Foreign Application Priority Data

Mar. 19, 2021 (TW) ................................ 110202951

(51) Int. Cl.
*G06F 3/16* (2006.01)
*H04R 3/00* (2006.01)
*H04R 29/00* (2006.01)

(52) U.S. Cl.
CPC .............. *G06F 3/165* (2013.01); *H04R 3/00* (2013.01); *H04R 29/001* (2013.01); *H04R 2430/01* (2013.01)

(58) Field of Classification Search
CPC ...... H03G 3/32; H04R 29/007; H04R 29/001; H04R 2430/01; H04R 3/00; G06F 3/165
USPC .......................................................... 381/57
See application file for complete search history.

(56) References Cited

U.S. PATENT DOCUMENTS

| | | | | |
|---|---|---|---|---|
| 8,964,998 | B1* | 2/2015 | McClain ................... | H03G 3/32 381/106 |
| 2009/0232319 | A1* | 9/2009 | Kao .......................... | H03G 3/32 381/57 |
| 2010/0074450 | A1* | 3/2010 | Liao .......................... | H03G 3/32 381/104 |
| 2011/0088053 | A1* | 4/2011 | Lee .......................... | H04H 60/59 725/19 |
| 2012/0201393 | A1* | 8/2012 | Cheek ....................... | H03G 3/32 381/94.1 |
| 2013/0287215 | A1* | 10/2013 | Kim ........................ | H03G 5/165 381/57 |
| 2015/0171813 | A1* | 6/2015 | Ganatra .................... | H03G 3/24 381/57 |
| 2015/0382097 | A1* | 12/2015 | Åstrand .................. | H04R 25/43 381/57 |
| 2016/0005308 | A1* | 1/2016 | Kohlrausch .......... | H04R 29/007 381/57 |

* cited by examiner

*Primary Examiner* — David L Ton
(74) *Attorney, Agent, or Firm* — HSML P.C.

(57) ABSTRACT

An audio player device includes a sound capturing unit, an audio speaker unit, a storage unit and a processing unit. The storage unit stores multiple environmental volume ranges, and multiple volume setting values respectively corresponding to the environmental volume ranges. The processing unit obtains an environmental volume based on environmental sound received by the sound capturing unit, and selects a volume setting value that corresponds to an environmental volume range which covers the environmental volume to be an automatically-determined volume setting value. Then, the processing unit controls an output volume of the audio speaker unit according to the automatically-determined volume setting value.

10 Claims, 4 Drawing Sheets

AUDIO PLAYER DEVICE, AND METHOD FOR AUTOMATICALLY ADJUSTING AN OUTPUT VOLUME OF THE AUDIO PLAYER DEVICE

CROSS-REFERENCE TO RELATED APPLICATION

This application claims priority of Taiwanese Utility Model Patent Application No. 110202951, filed on Mar. 19, 2021.

FIELD

The disclosure relates to an electronic device, and more particularly to an audio player device.

BACKGROUND

Users of audio playback devices usually adjust a volume level of the audio playback device based on a sound level of the surrounding environment. For example, the louder the ambient sound, the louder the user will adjust the volume of the audio playback device to be. The current approach to adjusting the volume is mostly through the operation of physical buttons or touch modules of the sound playback device. However, it is not convenient for the user to manually adjust the volume of the audio playback device every time the ambient sound volume changes.

SUMMARY

Therefore, an object of the disclosure is to provide an audio player device that can alleviate at least one of the drawbacks of the prior art.

According to the disclosure, the audio player device includes a sound capturing unit, an audio speaker unit, a storage unit and a processing unit. The storage unit stores multiple environmental volume ranges, and multiple volume setting values respectively corresponding to the environmental volume ranges. The processing unit is electrically connected to the sound capturing unit, the audio speaker unit and the storage unit. The processing unit is configured to: control the sound capturing unit to receive environmental sound for generating captured sound data; obtain an environmental volume based on the captured sound data; select one of the volume setting values that corresponds to one of the environmental volume ranges which covers the environmental volume to be an automatically-determined volume setting value; and control an output volume of the audio speaker unit according to the automatically-determined volume setting value.

Another object of the disclosure is to provide a method for automatically adjusting an output volume of an audio player device.

According to the disclosure, the audio player device includes a sound capturing unit, an audio speaker unit, a storage unit and a processing unit, and the method includes steps of: by the storage unit, storing multiple environmental volume ranges, and multiple volume setting values respectively corresponding to the environmental volume ranges therein; by the processing unit, controlling the sound capturing unit to receive environmental sound for generating captured sound data; by the processing unit, obtaining an environmental volume based on the captured sound data; by the processing unit, selecting one of the volume setting values that corresponds to one of the environmental volume ranges which covers the environmental volume to be an automatically-determined volume setting value; and by the processing unit, controlling an output volume of the audio speaker unit according to the automatically-determined volume setting value.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
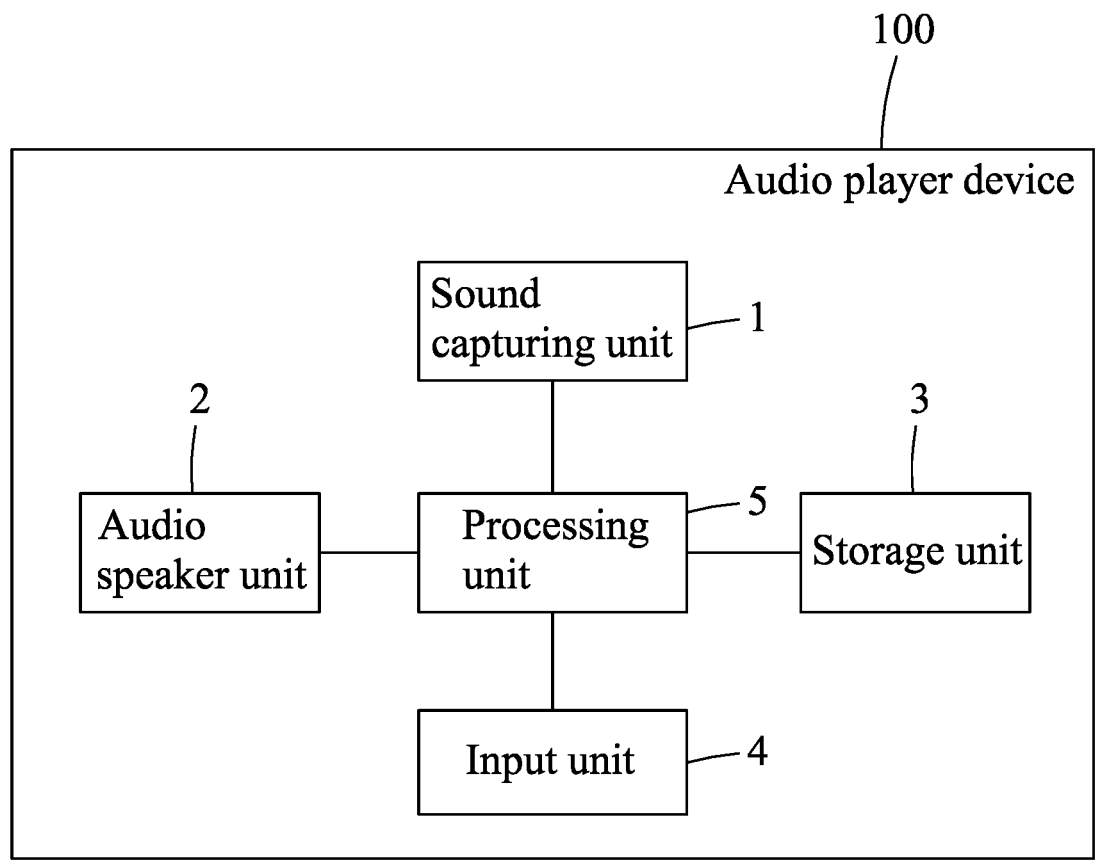
FIG. 1 is a block diagram illustrating an embodiment of an audio player device according to the disclosure.
Figure 2A:
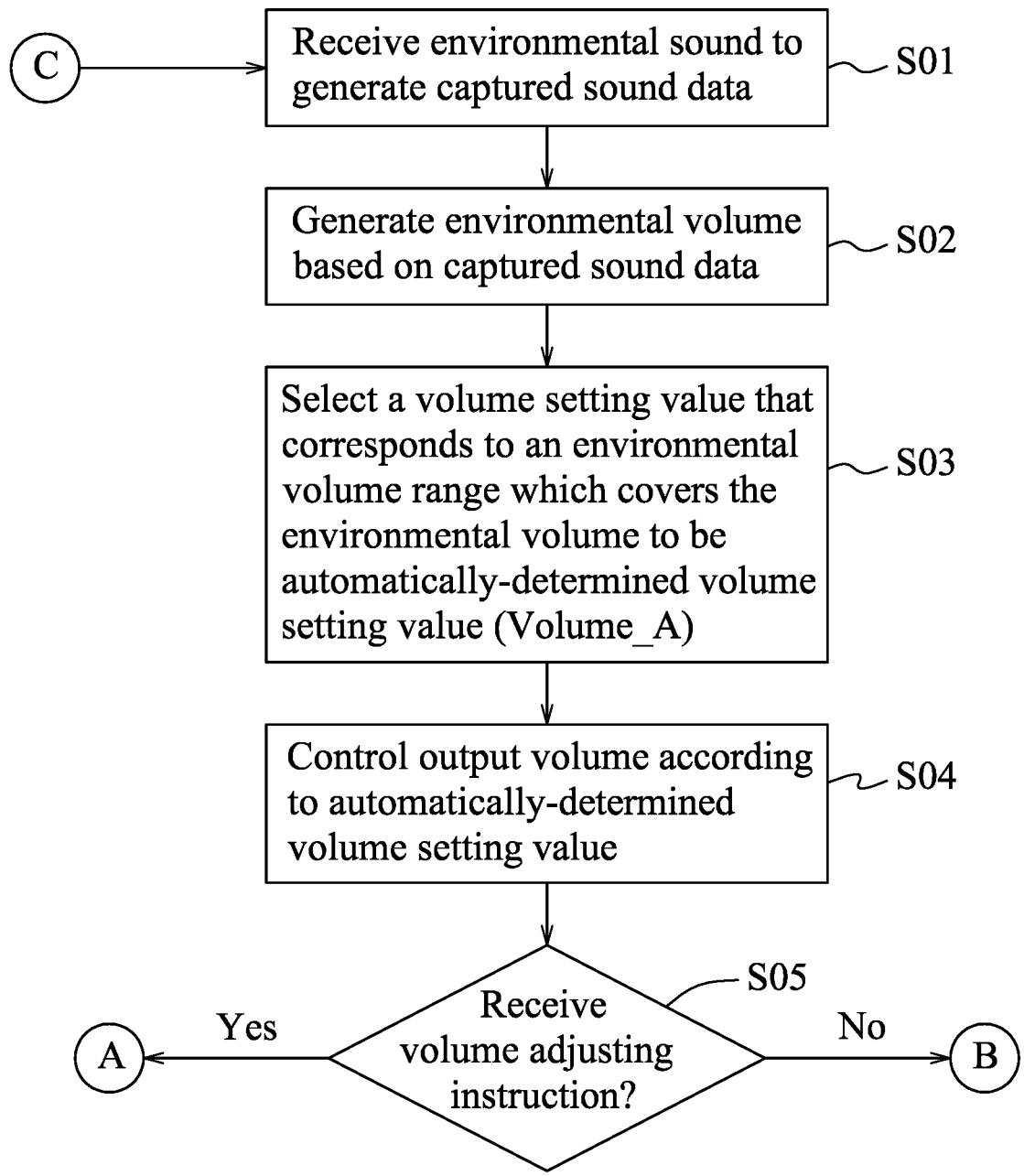
FIGS. 2A to 2C cooperatively constitute a flow chart illustrating steps of a method for automatically adjusting an output volume of an audio player device.
Figure 2B:
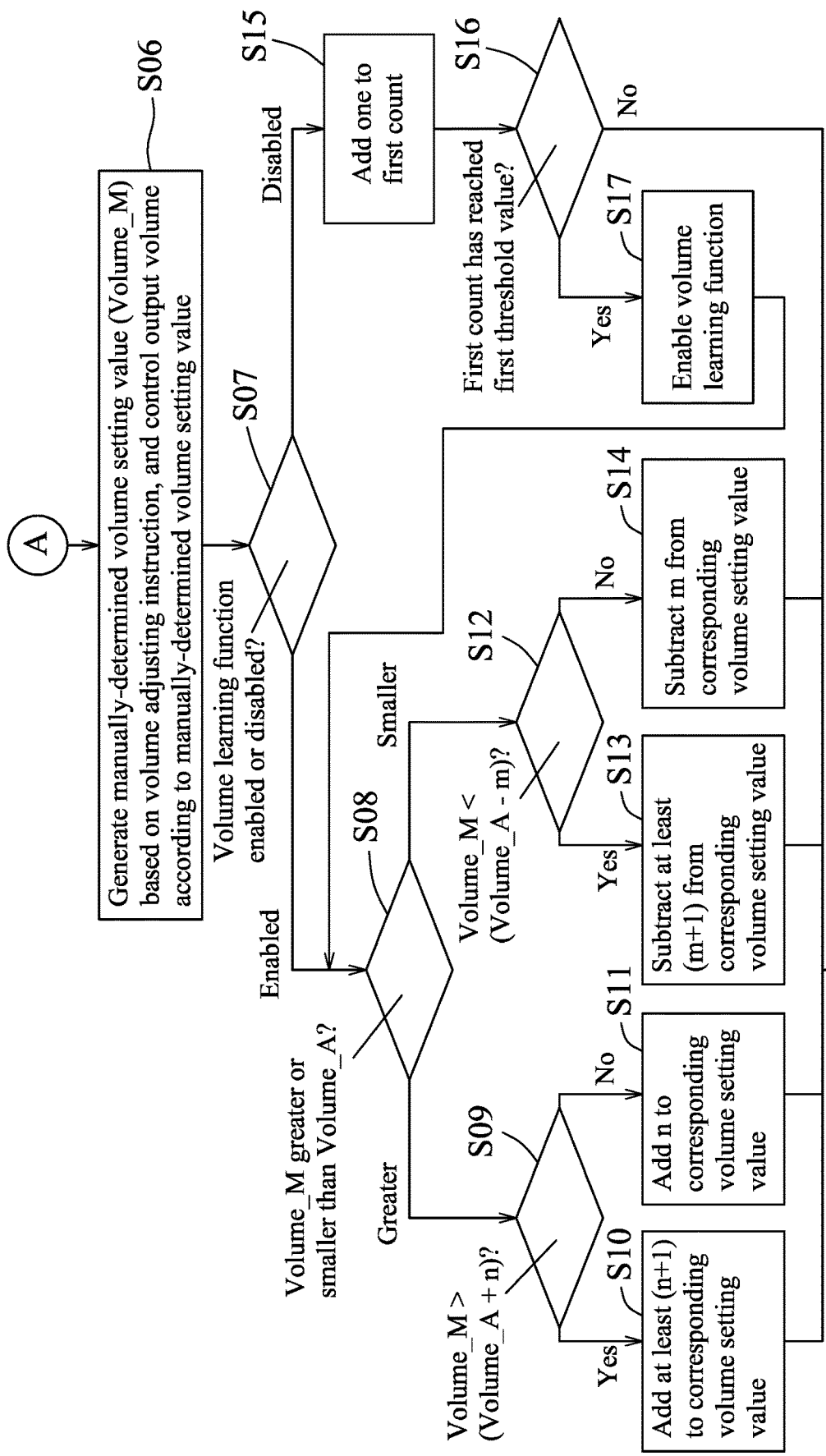
Figure 2C:
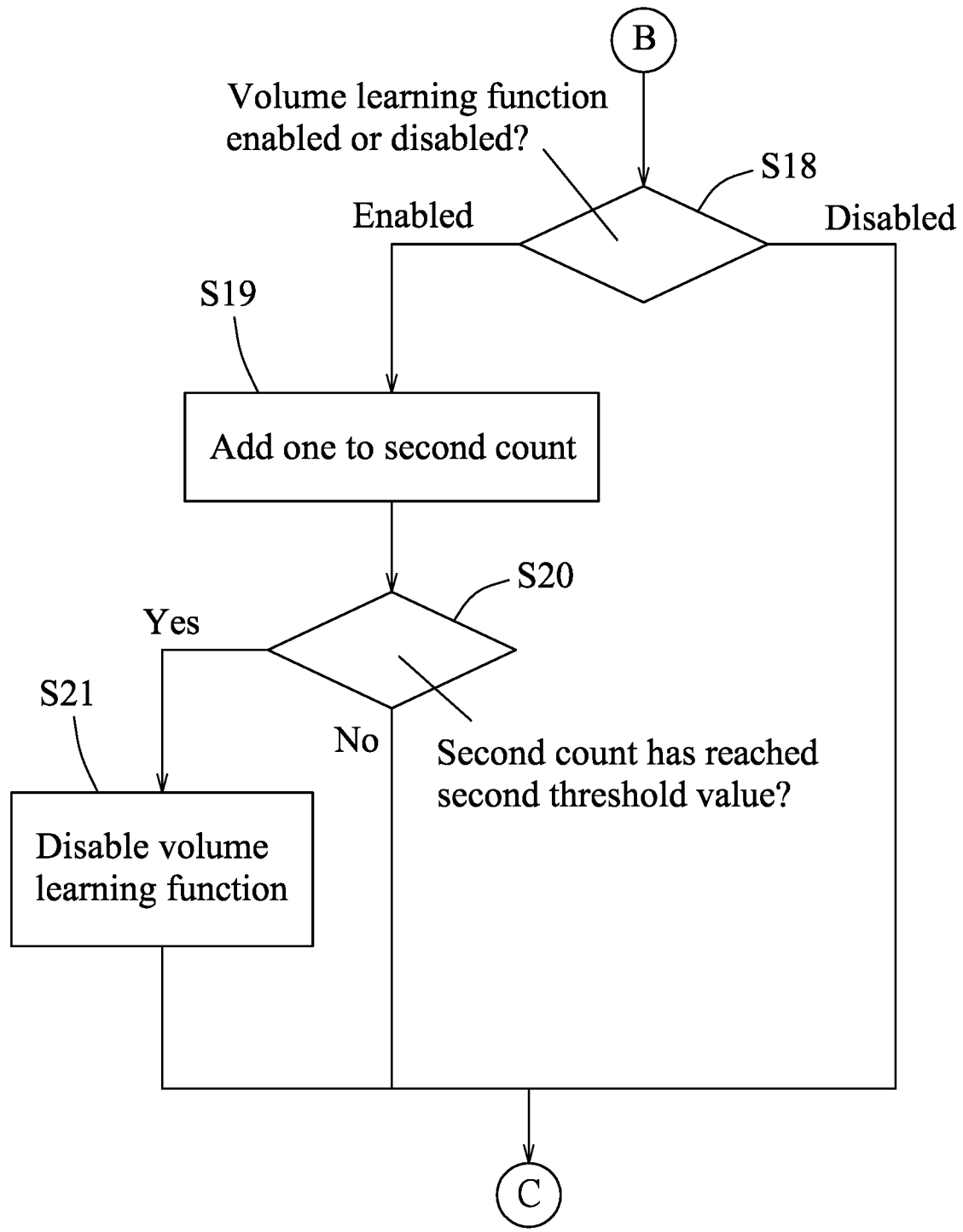

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, an embodiment of an audio player device 100 according to this disclosure is shown to include a sound capturing unit 1, an audio speaker unit 2, a storage unit 3, an input unit 4 and a processing unit 5. The audio player device 100 may be, for example, a smartphone, a music player device, a hearing aid, etc., but this disclosure is not limited in this respect.

The sound capturing unit 1 may include, for example, a microphone. The audio speaker unit 2 may include, for example, one or more speaker drivers. The input unit 4 may include, for example, a touchpad module, a touch screen module and/or a button module, which is for user operation.

The storage unit 3 stores multiple environmental volume ranges, and multiple volume setting values respectively corresponding to the environmental volume ranges. The storage unit 3 may include, for example, a flash memory module, a solid state drive, etc., but this disclosure is not limited in this respect. Table 1 exemplarily lists some environmental volume ranges and corresponding volume setting values.

TABLE 1

| Environmental volume range | Class | Volume setting value (15 levels in total) |
|---|---|---|
| ≤40 dB | Class 1 | 6 |
| >40 dB and ≤50 dB | Class 2 | 8 |
| >50 dB and ≤60 dB | Class 3 | 10 |
| >60 dB and ≤70 dB | Class 4 | 12 |
| >70 dB and ≤80 dB | Class 5 | 14 |
| >80 dB | Class 6 | 15 |

The processing unit 5 is electrically connected to the sound capturing unit 1, the audio speaker unit 2, the storage unit 3 and the input unit 4. The processing unit 5 may be, for example, a central processing unit (CPU), a microcontroller, etc., but this disclosure is not limited in this respect.

Referring to FIGS. 1, 2A, 2B and 2C, an embodiment of a method for automatically adjusting a volume of the audio player device 100 according to this disclosure is exemplarily described hereinafter.

In step S01, the processing unit 5 controls the sound capturing unit 1 to receive environmental sound to generate captured sound data. In this embodiment, the processing unit 5 may control the sound capturing unit 1 to continuously capture or pick up the environmental sound for, as an example but not limited to, 30 seconds to generate the captured sound data.

In step S02, the processing unit 5 generates an environmental volume based on the captured sound data. In this embodiment, the processing unit 5 calculates an average volume of the environmental sound captured by the sound capturing unit 1 based on the captured sound data, and makes the average volume serve as the environmental volume.

In step S03, the processing unit 5 selects one of the volume setting values that corresponds to one of the environmental volume ranges, which covers the environmental volume, to be an automatically-determined volume setting value. For example, as exemplified in Table 1, when the environmental volume is 45 dB, which falls in an environmental volume range of from 40 dB to 50 dB, the corresponding volume setting value is "8", so the processing unit selects "8" to be the automatically-determined volume setting value.

In step S04, the processing unit 5 controls an output volume of the audio speaker unit 2 according to the automatically-determined volume setting value.

As a result, a user does not need to manually adjust the output volume of the audio player device 100 when the environmental volume changes.

Then, in step S05, the processing unit 5 determines whether a volume adjusting instruction is received thereby from the input unit 4 within a predetermined period of time (for example but not limited to, counting from the time when the processing unit 5 controls the output volume of the audio speaker unit 2 according to the automatically-determined volume setting value). The volume adjusting instruction may be generated by, for example, the user operating the touchpad module, the touch screen module, or a volume control button of the button module. The flow goes to step S06 when the determination is affirmative, and goes to step S18 when otherwise.

In step S06, the processing unit 5 generates a manually-determined volume setting value based on the volume adjusting instruction, and controls the output volume of the audio speaker unit 2 according to the manually-determined volume setting value.

In step S07, the processing unit 5 determines whether a volume learning function of the audio player device 100 is enabled or disabled. The flow goes to step S08 to perform a volume learning procedure upon determining that the volume learning function is enabled, and goes to step S15 upon determining that the volume learning function is disabled.

In step S08, the processing unit 5 determines whether the manually-determined volume setting value is greater or smaller than the automatically-determined volume setting value. The flow goes to step S09 when the manually-determined volume setting value is greater than the automatically-determined volume setting value, and goes to step S12 when the manually-determined volume setting value is smaller than the automatically-determined volume setting value.

In step S09, the processing unit 5 determines whether the manually-determined volume setting value is greater than the automatically-determined volume setting value by more than a first predetermined value of n, where n is a positive integer. The flow goes to step S10 when the determination is affirmative, and goes to step S11 when otherwise. In this embodiment, n=1, but this disclosure is not limited in this respect.

In step S10, the processing unit 5 adds at least (n+1) to the volume setting value that corresponds to the environmental volume range which covers the environmental volume, and the flow goes back to step S01. It is noted that the value to be added to the volume setting value may be a predetermined value that is equal to or greater than (n+1). Table 2 illustrates an exemplary adjustment for step S10. Upon determining that the manually-determined volume setting value is greater than the automatically-determined volume setting value by more than the first predetermined value, which is "1" in this example, the processing unit 5 adds "2" to the volume setting value "8" that corresponds to the environmental volume range of ">40 dB and 50 dB" which covers the exemplary environmental volume of "45 dB", so the volume setting value that corresponds to the environmental volume range of ">40 dB and ≤ 50 dB" becomes "10".

TABLE 2

| Environmental volume range | Class | Volume setting value (15 levels in total) |
| --- | --- | --- |
| ≤40 dB | Class 1 | 6 |
| >40 dB and ≤50 dB | Class 2 | 8 → 10 |
| >50 dB and ≤60 dB | Class 3 | 10 |
| >60 dB and ≤70 dB | Class 4 | 12 |
| >70 dB and ≤80 dB | Class 5 | 14 |
| >80 dB | Class 6 | 15 |

In step S11, the processing unit 5 adds n to the volume setting value that corresponds to the environmental volume range which covers the environmental volume, and the flow goes back to step S01. Table 3 illustrates an exemplary adjustment for step S11. Upon determining that the manually-determined volume setting value is greater than the automatically-determined volume setting value by not more than the first predetermined value, which is "1" in this example, the processing unit 5 adds "1" to the volume setting value "8" that corresponds to the environmental volume range of ">40 dB and ≤50 dB" which covers the exemplary environmental volume of "45 dB", so the volume setting value that corresponds to the environmental volume range of ">40 dB and 50 dB" becomes "9".

TABLE 3

| Environmental volume range | Class | Volume setting value (15 levels in total) |
| --- | --- | --- |
| ≤40 dB | Class 1 | 6 |
| >40 dB and ≤50 dB | Class 2 | 8 → 9 |
| >50 dB and ≤60 dB | Class 3 | 10 |
| >60 dB and ≤70 dB | Class 4 | 17 |
| >70 dB and ≤80 dB | Class 5 | 14 |
| >80 dB | Class 6 | 15 |

In step S12, the processing unit 5 determines whether the manually-determined volume setting value is smaller than the automatically-determined volume setting value by more than a second predetermined value of m, where m is a positive integer. The flow goes to step S13 when the determination is affirmative, and goes to step S14 when otherwise. In this embodiment, m=n=1, but this disclosure is not limited in this respect. In some embodiments, the second predetermined value may be different from the first predetermined value (i.e., min).

In step S13, the processing unit 5 subtracts at least (m+1) from the volume setting value that corresponds to the environmental volume range which covers the environmental volume, and the flow goes back to step S01.

In step S14, the processing unit 5 subtracts m from the volume setting value that corresponds to the environmental volume range which covers the environmental volume, and the flow goes back to step S01.

By such a volume learning procedure, the automatically-determined volume setting value may better fit the volume preference of the user.

In step S15, which follows the processing unit 5 determining that the volume learning function is disabled in step S07, the processing unit 5 adds one to a first count.

In step S16, the processing unit 5 determines whether the first count has reached a first threshold value (e.g., 2). The flow goes to step S17 when the determination is affirmative, and goes back to step S01 when otherwise.

In step S17, the processing unit 5 enables the volume learning function, and the flow goes to step S08 to perform the volume learning procedure. In this embodiment, the processing unit 5 further resets the first count to zero in step S17.

In step S18, which follows the processing unit 5 determining that the volume adjusting instruction is not received from the input unit 4 within the predetermined period of time in step S05, the processing unit 5 determines whether the volume learning function of the audio player device 100 is enabled or disabled. The flow goes to step S19 upon determining that the volume learning function is enabled, and goes back to step S01 upon determining that the volume learning function is disabled.

In step S19, the processing unit 5 adds one to a second count.

In step S20, the processing unit 5 determines whether the second count has reached a second threshold value (e.g., 5). The flow goes to step S21 when the determination is affirmative, and goes back to step S01 when otherwise.

In step S21, the processing unit 5 disables the volume learning function. In this embodiment, the processing unit 5 further resets the second count to zero in step S21.

It is noted that, in this embodiment, the processing unit 5 may also reset the second count to zero upon determining that the volume adjusting instruction is received from the input unit 4 within the predetermined period of time in step S05, but this disclosure is not limited in this respect.

The algorithm to automatically enable or disable the volume learning function can prevent the processing unit 5 from adjusting the volume setting values too often.

In summary, the processing unit 5 of the audio player device 100 is configured to select the volume setting value that corresponds to the environmental volume range which covers the environmental volume to be the automatically-determined volume setting value, and to control the output volume of the audio speaker unit 2 according to the automatically-determined volume setting value, so the user does not need to manually adjust the volume of the audio player device 100 every time the environmental volume changes, and the convenience in terms of use is enhanced. Further, upon receipt of the volume adjusting instruction from the input unit 4, the processing unit 5 may adjust the volume setting value that corresponds to the environmental volume range which covers the environmental volume, so as to learn the volume preference of the user and make the automatically-determined volume setting value better fit the volume preference of the user.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. An audio player device, comprising:
   a sound capturing unit;
   an audio speaker unit;
   a storage unit that stores multiple environmental volume ranges, and multiple volume setting values respectively corresponding to the environmental volume ranges; an input unit; and
   a processing unit that is electrically connected to said sound capturing unit, said audio speaker unit, said input unit and said storage unit;
   wherein said processing unit is configured to:
   control said sound capturing unit to receive environmental sound for generating captured sound data,
   obtain an environmental volume based on the captured sound data,
      select one of the volume setting values that corresponds to one of the environmental volume ranges which covers the environmental volume to be an automatically-determined volume setting value, and
      control an output volume of said audio speaker unit according to the automatically-determined volume setting value,
   wherein said processing unit is configured to, after controlling the output volume of said audio speaker unit according to the automatically-determined volume setting value, determine whether said processing unit receives a volume adjusting instruction from said input unit within a predetermined period of time;
   wherein said processing unit is configured to, upon determining that said processing unit received the volume adjusting instruction from said input unit within the predetermined period of time, generate a manually-determined volume setting value based on the volume adjusting instruction, and control the output volume of said audio speaker unit according to the manually-determined volume setting value;
   wherein said processing unit is configured to perform a volume learning procedure including:

that, upon determining that the manually-determined volume setting value is greater than the automatically-determined volume setting value by more than a first predetermined value of n, said processing unit adds at least (n+1) to said one of the volume setting values that corresponds to said one of the environmental volume ranges which covers the environmental volume;

that, upon determining that the manually-determined volume setting value is greater than the automatically-determined volume setting value by not more than the first predetermined value of n, said processing unit adds n to said one of the volume setting values that corresponds to said one of the environmental volume ranges which covers the environmental volume;

that, upon determining that the manually-determined volume setting value is smaller than the automatically-determined volume setting value by more than a second predetermined value of m, said processing unit subtracts at least (m+1) from said one of the volume setting values that corresponds to said one of the environmental volume ranges which covers the environmental volume; and that, upon determining that the manually-determined volume setting value is smaller than the automatically-determined volume setting value by not more than the second predetermined value of m, said processing unit subtracts m from said one of the volume setting values that corresponds to said one of the environmental volume ranges which covers the environmental volume, wherein n and m are each a positive integer.

2. The audio player device of claim 1, wherein said processing unit is configured to determine whether a volume learning function is enabled or disabled after controlling the output volume of said audio speaker unit according to the manually-determined volume setting value, and the volume learning procedure is performed only when said processing unit determines that the volume learning function is enabled.

3. The audio player device of claim 2, wherein said processing unit is configured to, upon determining that the volume learning function is disabled, add one to a first count, and then determine whether the first count has reached a first threshold value; and wherein said processing unit is configured to, upon determining that the first count has reached the first threshold value, enable the volume learning function, and then perform the volume learning procedure.

4. The audio player device of claim 3, wherein said processing unit is configured to, after determining that said processing unit did not receive the volume adjusting instruction from said input unit within the predetermined period of time:

determine whether the volume learning function is enabled or disabled, upon determining that the volume learning function is enabled, add one to a second count, and then determine whether the second count has reached a second threshold value, and upon determining that the second count has reached the second threshold value, disable the volume learning function.

5. The audio player device of claim 4, wherein said processing unit is configured to reset the second count upon determining that said processing unit received the volume adjusting instruction from said input unit within the predetermined period of time.

6. A method for automatically adjusting an output volume of an audio player device, the audio player device including a sound capturing unit, an audio speaker unit, a storage unit and a processing unit, said method comprising steps of:

by the storage unit, storing multiple environmental volume ranges, and multiple volume setting values respectively corresponding to the environmental volume ranges therein;

by the processing unit, controlling the sound capturing unit to receive environmental sound for generating captured sound data;

by the processing unit, obtaining an environmental volume based on the captured sound data;

by the processing unit, selecting one of the volume setting values that corresponds to one of the environmental volume ranges which covers the environmental volume to be an automatically-determined volume setting value; and by the processing unit, controlling an output volume of the audio speaker unit according to the automatically-determined volume setting value;

wherein said method further comprises, after the step of controlling the output volume of the audio speaker unit according to the automatically-determined volume setting value, steps of:

by the processing unit, determining whether the processing unit receives a volume adjusting instruction from an input unit of the audio player device within a predetermined period of time;

by the processing unit, upon determining that the processing unit received the volume adjusting instruction from the input unit within the predetermined period of time, generating a manually-determined volume setting value based on the volume adjusting instruction, and controlling the output volume of the audio speaker unit according to the manually-determined volume setting value; and by the processing unit, performing a volume learning procedure that includes:

upon determining that the manually-determined volume setting value is greater than the automatically-determined volume setting value by more than a first predetermined value of n, adding at least (n+1) to said one of the volume setting values that corresponds to said one of the environmental volume ranges which covers the environmental volume;

upon determining that the manually-determined volume setting value is greater than the automatically-determined volume setting value by not more than the first predetermined value of n, adding n to said one of the volume setting values that corresponds to said one of the environmental volume ranges which covers the environmental volume;

upon determining that the manually-determined volume setting value is smaller than the automatically-determined volume setting value by more than a second predetermined value of m, subtracting at least (m+1) from said one of the volume setting values that corresponds to said one of the environmental volume ranges which covers the environmental volume; and upon determining that the manually-determined volume setting value is smaller than the automatically-determined volume setting value by not more than the second predetermined value of m, subtracting m from said one of the volume setting values that corresponds to said one of the environmental volume ranges which covers the environmental volume, wherein n and m are each a positive integer.

7. The method of Claim 6, further comprising, after the step of controlling the output volume of the audio speaker unit according to the manually-determined volume setting value, a step of:
 by the processing unit, determining whether a volume learning function is enabled or disabled;
wherein the step of performing volume learning procedure is performed only when the processing unit determines that the volume learning function is enabled.

8. The method of claim 7, further comprising steps of:
by the processing unit, upon determining that the volume learning function is disabled, adding one to a first count, and then determining whether the first count has reached a first threshold value; and
by the processing unit, upon determining that the first count has reached the first threshold value, enabling the volume learning function, and then performing the volume learning procedure.

9. The method of claim 8, further comprising, after determining that the processing unit did not receive the volume adjusting instruction from the input unit within the predetermined period of time, steps of:
 by the processing unit, determining whether the volume learning function is enabled or disabled;
 by the processing unit, upon determining that the volume learning function is enabled, adding one to a second count, and then determining whether the second count has reached a second threshold value; and
 by the processing unit, upon determining that the second count has reached the second threshold value, disabling the volume learning function.

10. The method of claim 9, further comprising a step of:
 by the processing unit, resetting the second count upon determining that the processing unit received the volume adjusting instruction from the input unit within the predetermined period of time.

\* \* \* \* \*